United States Patent
Abe et al.

(10) Patent No.: US 11,465,167 B2
(45) Date of Patent: Oct. 11, 2022

(54) SUBSTRATE TREATMENT APPARATUS

(71) Applicant: SCREEN Holdings Co., Ltd., Kyoto (JP)

(72) Inventors: Hiroshi Abe, Kyoto (JP); Manabu Okutani, Kyoto (JP); Takashi Ota, Kyoto (JP); Naohiko Yoshihara, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 17/014,352

(22) Filed: Sep. 8, 2020

(65) Prior Publication Data

US 2020/0398302 A1 Dec. 24, 2020

Related U.S. Application Data

(63) Continuation of application No. 15/896,137, filed on Feb. 14, 2018, now abandoned.

(30) Foreign Application Priority Data

Mar. 24, 2017 (JP) .............................. JP2017-058773

(51) Int. Cl.
*H01L 21/02* (2006.01)
*B05C 9/14* (2006.01)
(Continued)

(52) U.S. Cl.
CPC ............ *B05C 9/14* (2013.01); *B05C 11/1039* (2013.01); *B08B 3/10* (2013.01);
(Continued)

(58) Field of Classification Search
CPC ......... H01L 21/67023; H01L 21/67028; H01L 21/67034; H01L 21/6704; H01L 21/67051;
(Continued)

(56) References Cited

U.S. PATENT DOCUMENTS 4,968,375 A 11/1990 Sato et al.
6,179,924 B1 1/2001 Zhao et al.
(Continued)

FOREIGN PATENT DOCUMENTS

CN 105 826219 A 8/2016
CN 20578 7462 U 12/2016
(Continued)

OTHER PUBLICATIONS

Notification of Reason for Refusal dated Jan. 7, 2020 in counterpart Korean Patent Application No. 10-2018-0017748 with English translation obtained from the JPO.
(Continued)

*Primary Examiner* — David G Cormier
(74) *Attorney, Agent, or Firm* — Ostrolenk Faber LLP

(57) ABSTRACT

A substrate treatment apparatus includes: a substrate holding unit; a rotator for rotating the substrate holding unit; a first liquid nozzle for supplying a rinsing liquid; a second liquid nozzle for supplying a low surface tension liquid; a heater; a lifting mechanism for relatively moving up and down the heater between a contact position allowing the heater to be brought into contact with the lower surface of the substrate and a separation position allowing the heater to be separated from the substrate; a gas nozzle provided in an upper surface of the heater to suck the substrate; a suction pump for sucking an atmosphere above the heater through the gas nozzle; a gas supply source for supplying an inert gas toward above the heater through the gas nozzle; and a controller for selectively performing suction of the atmosphere or supply of the inert gas, through the gas nozzle.

6 Claims, 8 Drawing Sheets

(51) Int. Cl.
    *B08B 3/10*     (2006.01)
    *B05C 11/10*     (2006.01)
    *H01L 21/687*     (2006.01)
    *H01L 21/67*     (2006.01)
    *B05C 5/02*     (2006.01)

(52) U.S. Cl.
    CPC .. *H01L 21/67028* (2013.01); *H01L 21/67051* (2013.01); *H01L 21/68728* (2013.01); *H01L 21/68742* (2013.01); *B05C 5/02* (2013.01); *H01L 21/67023* (2013.01)

(58) Field of Classification Search
    CPC ........... H01L 21/6708; H01L 21/67098; H01L 21/67103; H01L 21/68728; H01L 21/68742; H01L 21/02043; H01L 21/02046; H01L 21/02054
    See application file for complete search history.

(56) References Cited

U.S. PATENT DOCUMENTS

| | | |
|---|---|---|
| 6,446,948 B1 | 9/2002 | Allen |
| 2002/0186967 A1 | 12/2002 | Ramanan et al. |
| 2011/0139183 A1 | 6/2011 | Mikhaylichenko et al. |
| 2014/0090669 A1 | 4/2014 | Hinode et al. |
| 2014/0127908 A1 | 5/2014 | Okutani ........................ 438/694 |
| 2014/0144464 A1 | 5/2014 | Kaneko et al. |
| 2015/0243542 A1 | 8/2015 | Yoshihara et al. |
| 2015/0258582 A1 | 9/2015 | Hashizume et al. |
| 2015/0318192 A1 | 11/2015 | Ito |
| 2016/0214148 A1 | 7/2016 | Okutani et al. |
| 2017/0117160 A1 | 4/2017 | Hashizume et al. |
| 2018/0138059 A1 | 5/2018 | Cho et al. |
| 2019/0172703 A1 | 6/2019 | Okutani et al. |

FOREIGN PATENT DOCUMENTS

| | | |
|---|---|---|
| JP | H02-130922 A | 5/1990 |
| JP | 2006-032605 A | 2/2006 |
| JP | 2007-273598 A | 10/2007 |
| JP | 2014-072389 A | 4/2014 |
| JP | 2014-112652 A | 6/2014 |
| JP | 2014-116480 A | 6/2014 |
| JP | 2015-185903 A | 10/2015 |
| JP | 2016-162847 A | 9/2016 |
| KR | 1992-0010730 B | 12/1992 |
| KR | 10-2001-0043049 A | 5/2001 |
| KR | 10-2004-0015731 A | 2/2004 |
| KR | 10-2012-0102110 A | 9/2012 |
| KR | 10-2015-0101951 A | 9/2015 |
| TW | 201420212 A | 6/2014 |
| TW | 201428838 A | 7/2014 |
| TW | 201604949 A | 2/2016 |
| WO | WO 2017/010663 A1 | 1/2017 |

OTHER PUBLICATIONS

Notification of Reason for Refusal dated Jul. 16, 2019 in counterpart Korean Patent Application No. 10-2018-0017748 with English translation obtained from One Portal Dossier.

Office Action dated Sep. 10, 2018 in counterpart Taiwanese Patent Application No. 106144347 with Japanese translation and English translation based on the Japanese translation. Portions relevant to prior-art based rejections are translated.

Notice of Reasons for Refusal dated Oct. 27, 2020 in corresponding Japanese Patent Application No. 2017-058773 and English translation.

First Action and Search Report dated Jun. 2, 2021 in corresponding Chinese Patent Application No. 201810159654.7 with machine-generated English translation thereof obtained from the JPO.

Second Office Action and Search Report dated Dec. 14, 2021 in corresponding Chinese Patent Application No. 201810159654.7 with machine-generated English translation thereof obtained from the JPO.

SUBSTRATE TREATMENT APPARATUS

CROSS-REFERENCE TO RELATED APPLICATIONS

The present patent application is a continuation of prior U.S. patent application Ser. No. 15/896,137 filed Feb. 14, 2018, by Hiroshi ABE, Manabu OKUTANI, Takashi OTA and Naohiko YOSHIHARA, entitled "SUBSTRATE TREATMENT APPARATUS," which claims priority of Japanese Patent Application No. 2017-058773, filed Mar. 24, 2017. The contents of each of the patent applications listed above are incorporated in full herein by reference.

BACKGROUND OF THE INVENTION

Field of the Invention

The present invention relates to a substrate treatment apparatus that applies treatment using a treatment liquid to a substrate. Examples of a substrate to be treated by the substrate treatment apparatus include a semiconductor substrate, a substrate for a liquid crystal display device, a substrate for a plasma display, a substrate for an field emission display (FED), a substrate for an optical disk, a substrate for a magnetic disk, a substrate for a magneto-optical disk, and a substrate for a photomask.

Description of the Background Art

In a manufacturing process of a semiconductor device, a treatment liquid is supplied to a surface of a substrate such as a semiconductor wafer so that the surface of the substrate is treated using the treatment liquid.

For example, a single-wafer type substrate treatment apparatus for treating substrates one by one includes a spin chuck for rotating a substrate while holding the substrate substantially horizontally, and a nozzle for supplying a treatment liquid to an upper surface of the substrate rotated by the spin chuck. A chemical liquid is supplied to the substrate held by the spin chuck, and then a rinsing liquid is supplied to replace the chemical liquid on the substrate with the rinsing liquid. After that, spin dry treatment for removing the rinsing liquid on the substrate is performed. In the spin dry treatment, the substrate is rotated at a high speed so that the rinsing liquid adhered to the substrate is spun off and removed (dried). With such a dry treatment method, the rinsing liquid having entered gaps between patterns formed on a surface of a substrate is not spun off, and the rinsing liquid may remain in the gaps between the patterns.

Thus, there is known a method for drying a surface of a substrate by supplying an organic solvent at normal temperature, such as an isopropyl alcohol (IPA) liquid, to an upper surface of the substrate after rinsing treatment to replace rinsing liquid having entered gaps between fine patterns on the upper surface of the substrate with the organic solvent.

Japanese Patent Application Laid-Open No. 2014-112652 discloses a technique for more reliably preventing collapse of a pattern on a substrate surface during drying of the substrate surface. This technique allows a liquid film of an organic solvent to be held in a paddle shape on an upper surface of a substrate (liquid film holding step). In this state, a lower surface of the substrate is heated with a heater (substrate heating step), and a vapor phase of an organic solvent is generated between the upper surface of the substrate and the liquid film of the organic solvent to float the liquid film from the upper surface of the substrate (liquid film floating step). After that, a drying region is formed at the center of the liquid film, and the drying region is sequentially enlarged from the substrate toward the periphery to remove the liquid film from the upper surface of the substrate while the liquid film is maintained in a liquid mass state (liquid film removing step).

According to the method disclosed in Japanese Patent Application Laid-Open No. 2014-112652, a substrate can be dried without leaving a treatment liquid in gaps between patterns to enable collapse of the patterns to be more reliably prevented during drying of the substrate. In the above method, the heater is brought into contact with the lower surface of the substrate in the substrate heating step. At this time, it is conceivable that the substrate is curved in a concave shape (i.e., the substrate has a central portion lower than its peripheral portion). In this case, the peripheral portion of the substrate is separated from the upper surface of the heater to cause heating of the substrate to be insufficient, so that the liquid film does not float from the upper surface of the substrate at the peripheral portion. In addition, there arises a problem that the liquid film cannot be smoothly removed from the peripheral portion in the liquid film removing step.

SUMMARY OF THE INVENTION

The present invention is directed to a substrate treatment apparatus.

A substrate treatment apparatus in an aspect of the present invention includes: a substrate holding unit provided with a chuck member that holds a circumference of a substrate; a rotator for rotating the substrate holding unit around a rotating axis; a first liquid nozzle for supplying a rinsing liquid to an upper surface of the substrate held by the chuck member; a second liquid nozzle for supplying a low surface tension liquid to replace the rinsing liquid to the upper surface of the substrate; a heater for heating the substrate from a lower surface of the substrate; a lifting mechanism for relatively moving up and down the heater between a contact position allowing the heater to be brought into contact with the lower surface of the substrate and a separation position allowing the heater to be separated from the lower surface of the substrate; a gas nozzle provided in an upper surface of the heater to suck the substrate; a suction pump for sucking an atmosphere above the heater through the gas nozzle; a gas supply source for supplying an inert gas toward above the heater through the gas nozzle; and a controller for selectively performing the suction of the atmosphere or the supply of the inert gas, through the gas nozzle.

This apparatus is capable of supplying an inert gas toward above the heater through the gas nozzle provided in the heater. Thus, in a stage where the rinsing liquid or the low surface tension liquid is supplied to the upper surface of the substrate, the inert gas can be discharged through the gas nozzle. As a result, even if the rinsing liquid or the low surface tension liquid falls from the substrate onto the heater, it is possible to prevent the liquid from entering the gas nozzle. In a stage where a substrate is heated by the heater while the low surface tension liquid adheres to a surface of the substrate, the substrate can be sucked onto the upper surface of the heater through the gas nozzle. As a result, the substrate can be prevented from being bent by heating, so that the substrate can be uniformly heated.

Thus, it is an object of the present invention to provide a substrate treatment apparatus capable of preventing a substrate from being bent and of uniformly heating the entire surface of the substrate when the heater is brought into contact with a lower surface of the substrate to heat the substrate.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, preferred embodiments of the present invention will be described in detail with reference to the accompanying drawings.

Figure 1:
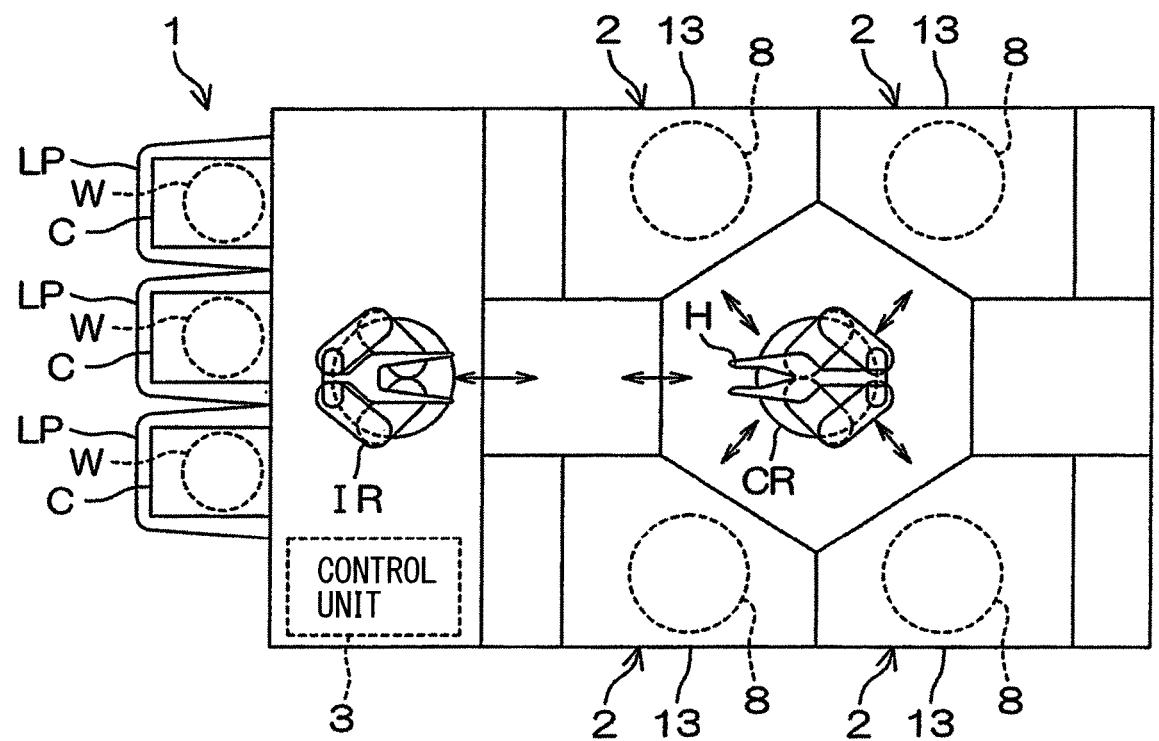
FIG. 1 is a schematic plan view for illustrating a layout inside a substrate treatment apparatus according to a preferred embodiment of the present invention.

FIG. 1 is a schematic plan view for illustrating a layout inside a substrate treatment apparatus according to a preferred embodiment of the present invention. A substrate treatment apparatus 1 is a single wafer type apparatus that treats a substrate W such as a silicon wafer one by one. In the present preferred embodiment, the substrate W is a discoid substrate. The substrate treatment apparatus 1 includes a plurality of treatment units 2 for treating a substrate W with a treatment liquid, a load port LP on which a carrier C for accommodating a plurality of substrates W to be treated by a treatment unit 2 is placed, transfer robots IR and CR for transferring the substrate W between the load port LP and the treatment unit 2, and a control unit ("controller", "control means") 3 for controlling the substrate treatment apparatus 1. The transfer robot IR transfers a substrate W between the carrier C and the transfer robot CR. The transfer robot CR transfers a substrate W between the transfer robot IR and the treatment unit 2. The plurality of treatment units 2 has the same configuration, for example.

Figure 2:
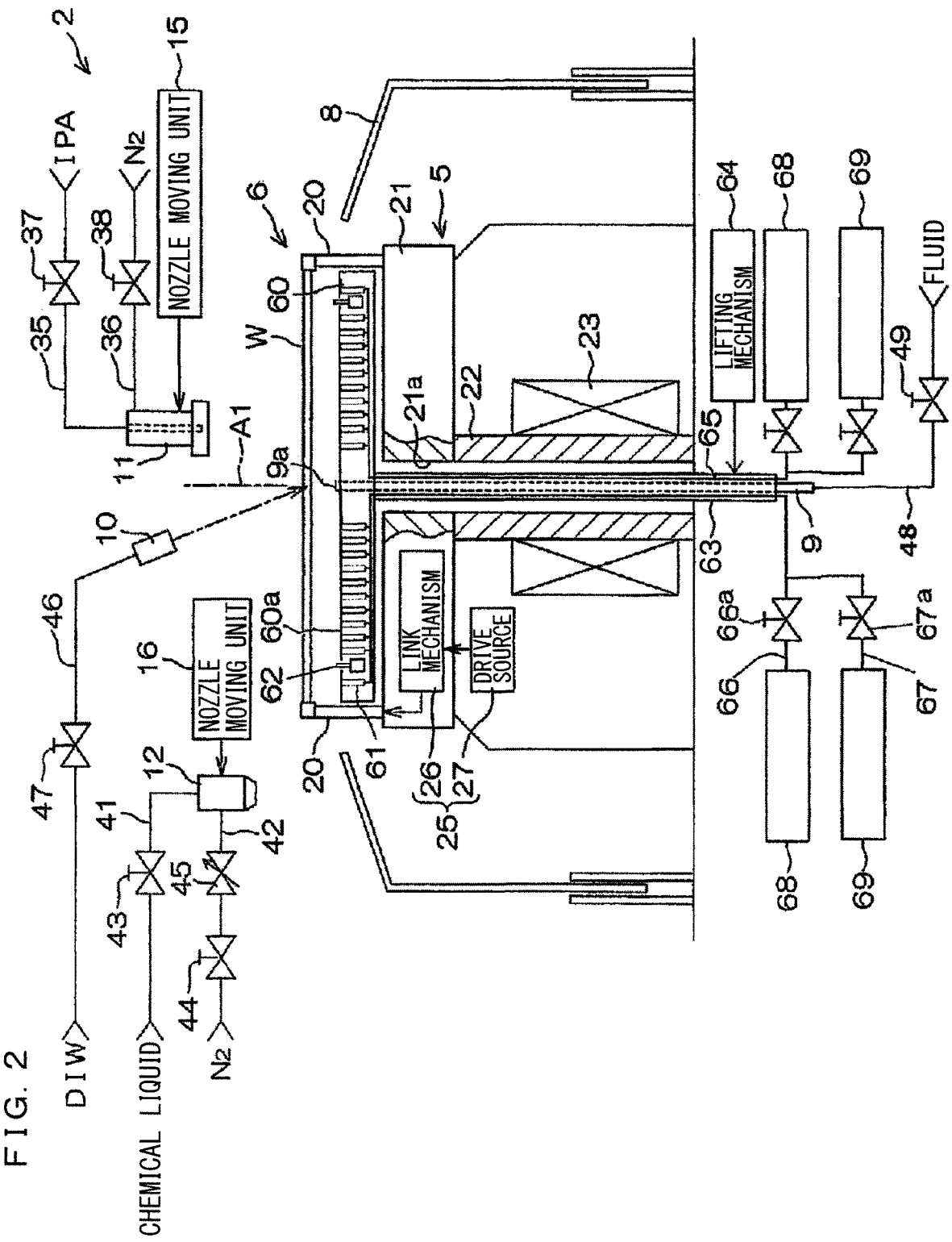
FIG. 2 is a schematic sectional view for illustrating a configuration example of a treatment unit provided in the substrate treatment apparatus of FIG. 1.

FIG. 2 is a schematic sectional view for illustrating a configuration example of the treatment unit 2. The treatment unit 2 includes: a spin chuck 5 that rotates a substrate W around a vertical rotation axis A1 passing through a center portion of the substrate W while holding the single substrate W in a horizontal posture; a heater unit 6 that heats the substrate W from a lower surface side of the substrate W; a cup 8 in a cylindrical shape, surrounding the spin chuck 5; a lower-surface nozzle 9 for supplying a treatment fluid to a lower surface of the substrate W; a DIW nozzle ("first liquid nozzle", "rinsing liquid supply means") 10 for supplying deionized water (DIW) as a rinsing liquid to an upper surface of the substrate W; a first moving nozzle 11 movable above the substrate W; and a second moving nozzle 12 movable above the substrate W. The treatment unit 2 further includes a chamber 13 for accommodating the cup 8 (refer to FIG. 1). While there is no illustration, the chamber 13 includes a transfer-in-and-out port for transferring in and out the substrate W, and a shutter unit for opening and closing the transfer-in-and-out port.

The spin chuck 5 includes a chuck pin ("chuck member") 20, a spin base ("substrate holding portion") 21, a rotating shaft 22 connected to the center of a lower surface of the spin base 21, and an electric motor ("rotator") 23 that applies a rotating force to the rotating shaft 22. The rotating shaft 22 extends vertically along the rotation axis A1, and is a hollow shaft in the present preferred embodiment. The rotating shaft 22 is connected at its upper end with the spin base 21. The spin base 21 has a disk shape along a horizontal direction. A plurality of chuck pins 20 is disposed in a peripheral portion of an upper surface of the spin base 21 at intervals in a circumferential direction of the upper surface. The plurality of chuck pins 20 can be opened and closed between a closed state where the chuck pins 20 are brought into contact with the peripheral edge of the substrate W to grip (hold) the substrate W, and an open state where the chuck pins 20 are retracted from the peripheral edge of the substrate W. In the closed state, the plurality of chuck pins 20 can also support the substrate W from below by being brought into contact with a lower surface of a peripheral portion of the substrate W.

There is provided a chuck-pin drive unit 25 that drives each of the chuck pins 20 for opening and closing. The chuck-pin drive unit 25 includes a link mechanism 26 built in the spin base 21 and a drive source 27 disposed outside the spin base 21, for example. The drive source 27 includes a ball screw mechanism and an electric motor that applies a driving force to the ball screw mechanism, for example. A specific configuration example of the chuck pin drive unit 25 is described in Japanese Patent Application Laid-Open No. 2015-185903, for example.

The heater unit 6 will be described with reference to FIGS. 2 and 3. The heater unit 6 includes: a heater body ("heater", "heating means") 60 in a disk shape disposed between an upper side of the spin base 21 and the substrate W held by the chuck pins 20; a heating element (not illustrated) embedded inside the heater body 60; a plurality of gas nozzles ("gas flow nozzles") 61 disposed in an upper surface (heater upper surface 60a) of the heater body 60; a plurality of push-up pin units 62 (four in the present preferred embodiment) embedded in the heater upper surface 60a; a hollow support shaft 63 extending vertically along the rotation axis A1 to be connected to a lower surface of the heater body 60; a lifting mechanism, i.e., a lifter ("lifter", "heating-means lifting means") 64 coupled to the support shaft 63 to move up and down the heater body 60 among the following three positions: an upper position ("contact position") at which the heater body 60 is brought into close contact with a substrate W held by the chuck pins 20 from below; a lower position ("separation position") away downward from the substrate W; and a position between the upper position and the lower position (more specifically, a proximity position at which the heater upper surface 60a is close to the lower surface of the substrate W); a pipe 65 disposed inside the support shaft 63 to communicate with the gas nozzles 61; a charging branch pipe 66 and a suction branch pipe 67 each branching at an lower end opening of the pipe 65; an inert gas supply means ("gas source", "gas supply source", "inert gas supply source", "inert gas cylinder", "charging means") 68 communicating with the charging branch pipe 66 to supply an inert gas such as a nitrogen gas to the plurality of gas nozzles 61 through the charging branch pipe 66 and the pipe 65; a suction means ("suction pump") 69 communicating with the suction branch pipe 67 to suck an atmosphere above the gas nozzles 61 through the pipe 65 and the suction branch pipe 67; and a charging valve 66a and a suction valve 67a that are provided in the charging branch pipe 66 and the suction branch pipe 67, respectively, to open and close flow channels thereof.

The first moving nozzle 11 ("second liquid nozzle", "treatment liquid supply means", "low surface tension liquid supply means") is moved horizontally and vertically by a first nozzle moving unit 15. The first moving nozzle 11 is moved horizontally to be movable between a treatment position that faces a rotation center of the upper surface of the substrate W and a home position (retracted position) that does not face the upper surface of the substrate W. The rotation center of the upper surface of the substrate W is a position at which the upper surface of the substrate W intersects the rotation axis A1. The home position that does not face the upper surface of the substrate W may be a position outside the spin base 21 in plan view, more specifically, a position outside the cup 8. The first moving nozzle 11 is moved vertically to be able to approach the upper surface of the substrate W and to retract upward from the upper surface of the substrate W. The first nozzle moving unit 15 includes a rotating shaft extending along a vertical direction, an arm connected to the rotating shaft and extending horizontally, and an arm driving mechanism for driving the arm, for example. The arm driving mechanism oscillates the arm by rotating the rotating shaft around a vertical rotation axis, and moves up and down the arm by moving up and down the rotating shaft along the vertical direction. The first moving nozzle 11 is fixed to the arm. The first moving nozzle 11 moves horizontally and vertically as the arm is oscillated and moved up and down.

The second moving nozzle 12 (treatment liquid supply means) is moved horizontally and vertically by the second nozzle moving unit 16. The second moving nozzle 12 is moved horizontally to be movable between a position that faces the rotation center of the upper surface of substrate W and a home position (retracted position) that does not face the upper surface of the substrate W. The home position may be a position outside the spin base 21 in plan view, more specifically, a position outside the cup 8. The second moving nozzle 12 is moved vertically to be able to approach the upper surface of the substrate W and to retract upward from the upper surface of the substrate W. The second nozzle moving unit 16 includes a rotating shaft extending along a vertical direction, an arm connected to the rotating shaft and extending horizontally, and an arm driving mechanism for driving the arm, for example. The arm driving mechanism oscillates the arm by rotating the rotating shaft around a vertical rotation axis, and moves up and down the arm by moving up and down the rotating shaft along the vertical direction. The second moving nozzle 12 is fixed to the arm. The second moving nozzle 12 moves horizontally and vertically as the arm is oscillated and moved up and down.

In the present preferred embodiment, the first moving nozzle 11 serves as an organic solvent nozzle for discharging an organic solvent from a discharge port (not shown) as well as serves as a gas nozzle for discharging an inert gas such as a nitrogen gas. The first moving nozzle 11 is connected to an organic solvent supply pipe 35 and an inert gas supply pipe 36. The organic solvent supply pipe 35 is provided with an organic solvent valve 37 for opening and closing a flow channel thereof. The inert gas supply pipe 36 is provided with an inert gas valve 38 for opening and closing a flow channel thereof. The organic solvent supply pipe 35 is supplied with an organic solvent such as isopropyl alcohol (IPA) from an organic solvent supply source. The inert gas supply pipe 36 is supplied with an inert gas such as nitrogen gas ($N_2$) from an inert gas supply source.

In the present preferred embodiment, the second moving nozzle 12 serves as a chemical liquid nozzle for supplying a chemical liquid such as acid and alkali as well as serves a gas nozzle for discharging an inert gas such as a nitrogen gas. More specifically, the second moving nozzle 12 may have a form of a two-fluid nozzle capable of mixing and discharging a liquid and a gas. The two-fluid nozzle can be used as a liquid nozzle by stopping supply of a gas and discharging a liquid, and can be used as a gas nozzle by stopping supply of a liquid and discharging a gas. The second moving nozzle 12 is connected to a chemical liquid supply pipe 41 and an inert gas supply pipe 42. The chemical liquid supply pipe 41 is provided with a chemical liquid valve 43 for opening and closing a flow channel thereof. The inert gas supply pipe 42 is provided with an inert gas valve 44 for opening and closing a flow channel thereof, and with a flow rate variable valve 45 for varying a flow rate of an inert gas. The chemical liquid supply pipe 41 is supplied with a chemical liquid such as acid and alkali from a chemical liquid supply source. The inert gas supply pipe 42 is supplied with an inert gas such as nitrogen gas ($N_2$) from an inert gas supply source.

Specific examples of the chemical liquid are an etching liquid and a cleaning liquid. More specifically, the chemical liquid may be hydrofluoric acid, a mixed liquid of ammonia hydrogen peroxide (SC1), a mixed liquid of hydrochloric acid and hydrogen peroxide (SC2), buffered hydrofluoric acid (a mixed liquid of hydrofluoric acid and ammonium fluoride), SPM, or the like.

In the present preferred embodiment, the DIW nozzle 10 is a fixed nozzle disposed to discharge DIW toward the rotation center of the upper surface of the substrate W. The DIW nozzle 10 is supplied with DIW from a DIW supply source through a DIW supply pipe 46. The DIW supply pipe 46 is provided with a DIW valve 47 for opening and closing a flow channel thereof. The DIW nozzle 10 does not need to be a fixed nozzle, and may be a moving nozzle that moves at least in a horizontal direction.

The lower surface nozzle 9 ("treatment liquid supply means") is inserted into the hollow support shaft 63, and passes through the heater unit 6. The lower surface nozzle 9 is provided at its upper end with a discharge port 9a facing the center of a lower surface of a substrate W. The lower surface nozzle 9 is supplied with a treatment fluid from a fluid supply source trough a fluid supply pipe 48. The treatment fluid to be supplied may be a liquid or a gas. The fluid supply pipe 48 is provided with a fluid valve 49 for opening and closing a flow channel thereof.

Figure 3:
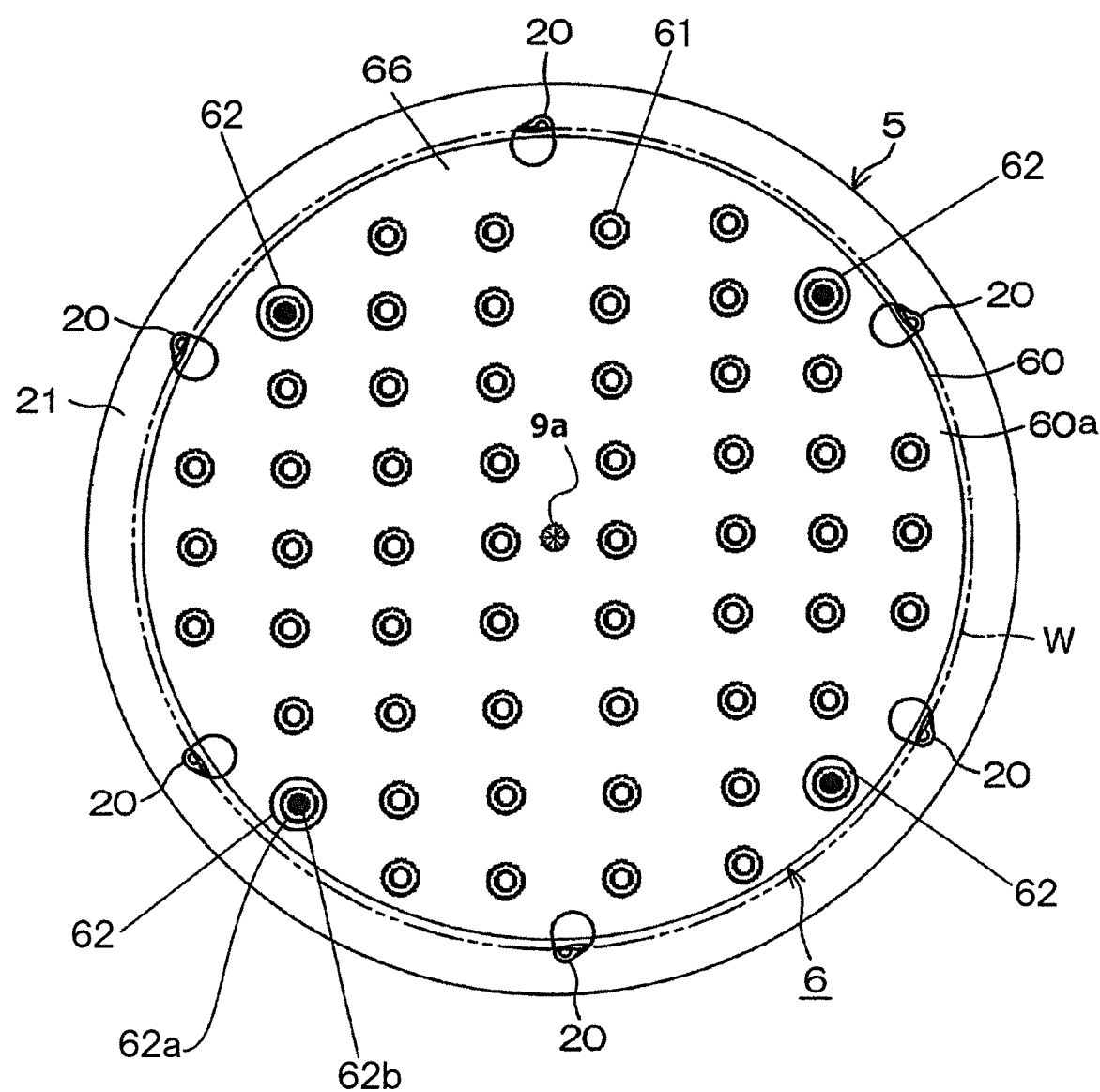
FIG. 3 is a plan view of a spin chuck and a heater unit provided in the treatment unit of FIG. 2.

FIG. 3 is a plan view of the spin chuck 5 and the heater unit 6. The spin base 21 of the spin chuck 5 has a circular shape centered on the rotation axis A1 in plan view, and has a diameter larger than a diameter of the substrate W. A plurality (six in the present preferred embodiment) of chuck pins 20 is disposed in a peripheral portion of the spin base 21 at intervals.

The heater unit 6 has a disk shape. As described above, the heater unit 6 includes the heater body 60, the plurality of gas nozzles 61, and the plurality of push-up pin units 62. In plan view, the heater body 60 is formed in a circular shape that is substantially identical to an outer shape of the substrate W in shape and size, and that is centered on the rotation axis A1. More precisely, the heater body 60 has a circular planar shape with a diameter slightly smaller than a diameter of the substrate W. For example, when the substrate W has a diameter of 300 mm, the heater body 60 (particularly a diameter of the heater upper surface 60a) may have a diameter of 294 mm smaller than that of the substrate W by 6 mm. In this case, the heater body 60 has a radius smaller than a radius of the substrate W by 3 mm.

The heater upper surface 60a is a plane along a horizontal plane. This enables a distance between the heater upper surface 60a and the substrate W horizontally held by the chuck pins 20 to be uniformly maintained. As a result, the substrate W can be efficiently and uniformly heated.

The plurality of gas nozzles 61 each has a circular shape in plan view, and has a diameter of about 1 mm, for example. The plurality of gas nozzles 61 is disposed in the heater upper surface 60a at equal intervals. It is desirable to set the number and intervals of the plurality of gas nozzles 61 in the heater upper surface 60a, and a distance between the heater upper surface 60a and the substrate W so that the plurality of gas nozzles 61 can evenly discharge inert gas over the entire lower surface of the substrate W.

Each of the plurality of push-up pin units 62 includes a pin 62a for pushing up the substrate W held by the spin chucks 20 from below, and a cylinder 62b for vertically moving the pin 62a. The cylinder 62b vertically moves the pin 62a between a projecting position at which an upper end of the pin 62a is positioned above the upper surface 60a of the heater body 60 and a retracted position at which the upper end of the pin 62a is positioned on the same surface as the upper surface 60a.

Figure 4:
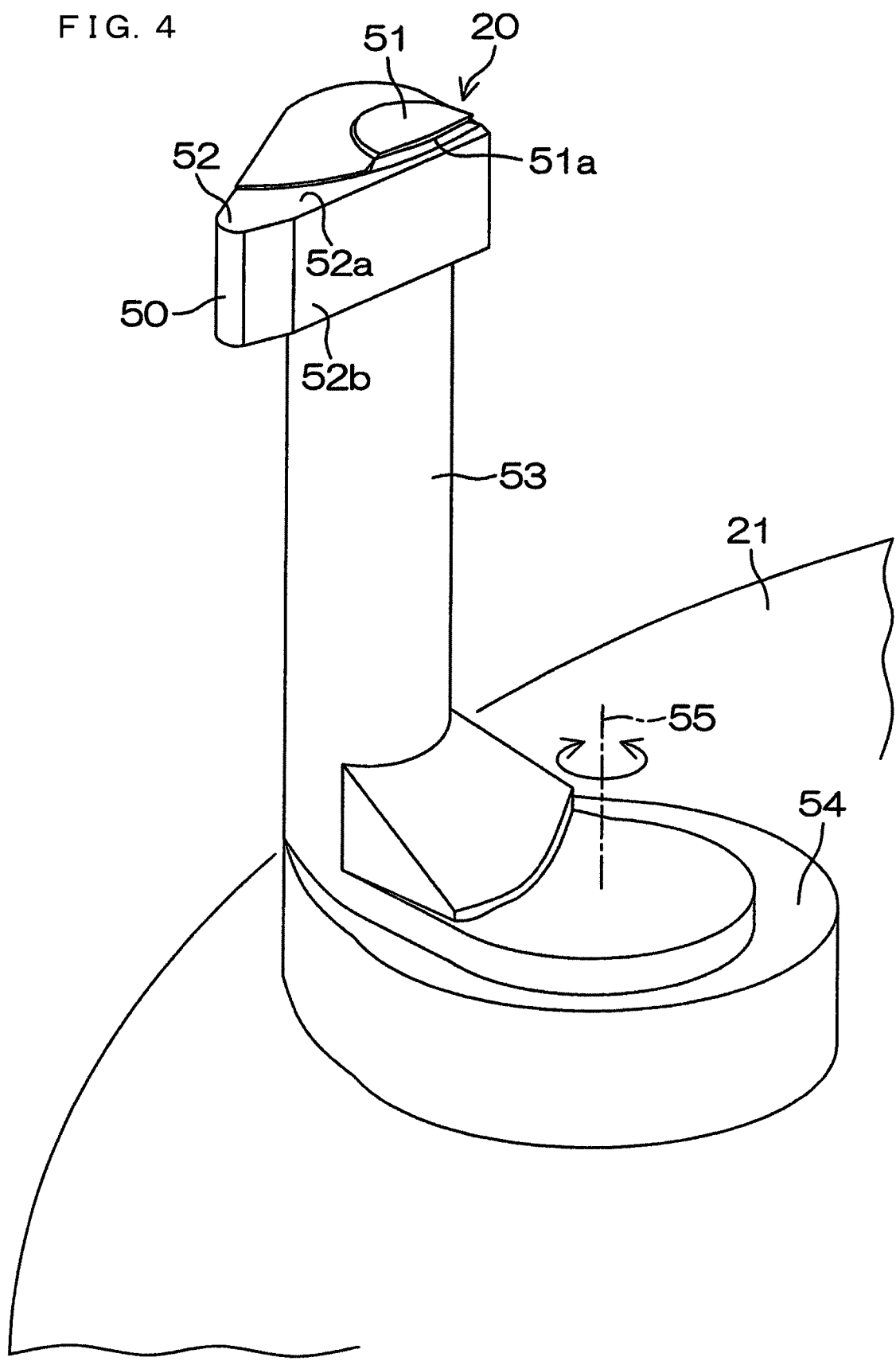
FIG. 4 is a perspective view for illustrating a structural example of a chuck pin provided in the spin chuck of FIG. 3.
Figure 5A:
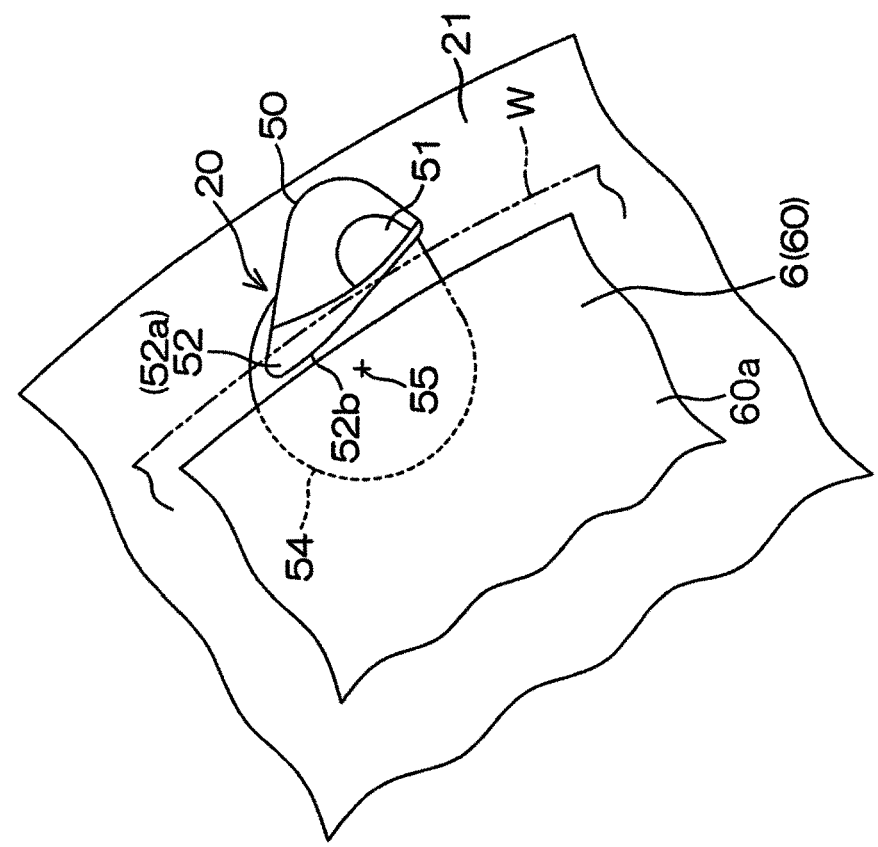
FIG. 5A is a plan view illustrating a chuck pin in a closed state.
Figure 5B:
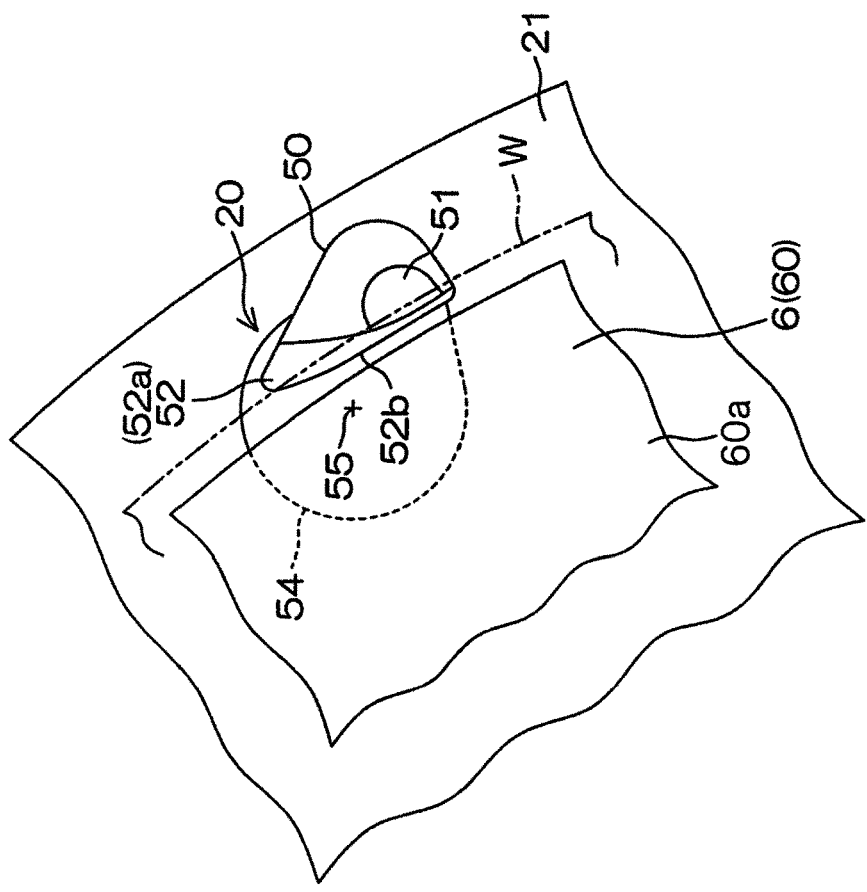
FIG. 5B is a plan view illustrating a chuck pin in an open state.

FIG. 4 is a perspective view for illustrating a structural example of the chuck pin 20. FIGS. 5A and 5B each are a plan view of the chuck pin 20. FIG. 5A illustrates a closed state, and FIG. 5B illustrates an open state.

The chuck pin 20 includes a shaft portion 53 extending vertically, a base portion 50 provided at an upper end of the shaft portion 53, and a rotation support portion 54 provided at a lower end of the shaft portion 53. The base portion 50 includes a holding portion 51 and a support portion 52. The rotation support portion 54 is connected to the spin base 21 so as to be rotatable around a chuck rotation axis 55 along a vertical direction. The shaft portion 53 is displaced to a position away from the chuck rotation axis 55 to be connected to the rotation support portion 54. More specifically, the shaft portion 53 is disposed at a position further away from the rotation axis A1 than the chuck rotation axis 55. Thus, when the chuck pin 20 is rotated around the chuck rotation axis 55, the entire base portion 50 rotates around the chuck rotation axis 55 while moving along a peripheral end surface of the substrate W. The rotation support portion 54 is connected to a link mechanism 26 (refer to FIG. 2) provided inside the spin base 21. Driving force from the link mechanism 26 causes the rotation support portion 54 to oscillate around the chuck rotation axis 55 within a predetermined angular range.

The base portion 50 is formed in a wedge shape in plan view. The base portion 50 is provided in its upper surface with a support surface 52a so that the support surface 52a is brought into contact with a lower surface of a peripheral portion of a substrate W to support the substrate W from below when the chuck pins 20 each are in the open state. In other words, the base portion 50 has the support portion 52 with the support surface 52a as its upper surface. The holding portion 51 projects upward at a position different from the support portion 52 on the upper surface of the base portion 50. The holding portion 51 has a holding groove 51a that is opened in a V-shape so as to face the peripheral end surface of the substrate W.

When the rotation support portion 54 is rotated clockwise around the chuck rotation axis 55 from the open state illustrated in FIG. 5B, the holding portion 51 approaches the peripheral end surface of the substrate W, and the support portion 52 moves away from the rotation center of the substrate W. When the rotation support portion 54 is rotated counterclockwise around the chuck rotation axis 55 from the closed state illustrated in FIG. 5A, the holding portion 51 moves away from the peripheral end surface of the substrate W, and the support portion 52 approaches the rotation center of the substrate W.

In the closed state of the chuck pin 20 illustrated in FIG. 5A, the peripheral end surface of the substrate W enters the holding groove 51a. At this time, the lower surface of the substrate W is positioned at a height away upward from the support surface 52a by a minute distance. In the open state of the chuck pin 20 illustrated in FIG. 5B, the peripheral end surface of the substrate W comes out from the holding groove 51a, and the holding portion 51 is positioned outside the peripheral end surface of the substrate W in plan view. In any one of the open and closed states of the chuck pin 20, at least a part of the support surface 52a is positioned below the lower surface of the peripheral portion of the substrate W.

When the chuck pin 20 is in the open state, the substrate W can be supported by the support portion 52. When the chuck pin 20 is switched from the open state to the closed state, the peripheral end surface of the substrate W is guided into the holding groove 51a while gradually rising by being guided by the holding groove 51a having a V-shaped cross section. As a result, the substrate W is held by upper and lower inclined surfaces of the holding groove 51a. When the chuck pin 20 is switched from the state to the open state, the peripheral end surface of the substrate W slides down while being guided by the lower inclined surface of the holding groove 51a, and the lower surface of the peripheral portion of the substrate W is brought into contact with the support surface 52a.

As illustrated in FIGS. 5A and 5B, in the base portion 50, an edge portion of the base portion 50, facing the heater body 60, follows a peripheral edge shape of the heater body 60 in plan view. That is, the support portion 52 has a side surface 52b positioned outward from the heater body 60 with respect to the rotation center in plan view. This causes the heater body 60 having the circular heater upper surface ("heating surface") 60a slightly smaller than the substrate W in diameter not to interfere with the chuck pin 20 when the heater unit 6 moves vertically. This non-interfering positional relationship is maintained in both the closed state and the open state of the chuck pin 20. That is, when the chuck pin 20 is in any one of the closed state and the open state, the side surface 52b of the support portion 52 is outward away from the heater upper surface 60a being the upper surface of the heater body 60 of the heater unit 6 in plan view.

The substrate W has a diameter of 300 mm, for example, and the heater upper surface 60a has a diameter of 294 mm, for example. Thus, the heater upper surface 60a faces substantially the entire region including the central region and the peripheral region of the lower surface of the substrate W. When the chuck pin 20 is in any one of the closed state and the open state, the support portion 52 is disposed while a gap of a predetermined minute gap (e.g., 2 mm) or more is secured outside the outer peripheral edge of the heater upper surface 60a.

The holding portion 51 is configured such that an inner edge thereof is positioned while securing a gap of a predetermined minute interval (for example, 2 mm) or more secured outside the outer peripheral edge of the heater body 60 when the chuck pin 20 is in the closed state. Thus, when the chuck pin 20 is in any one of the closed state and the open state, the heater upper surface 60a can vertically move relatively to the lower surface of the substrate W inside the holding portion 51.

In plan view, the chuck rotation axis 55 is positioned on the circumference of a circle having a radius smaller than a radius of the heater upper surface 60a, the circle being centered on the rotation axis A1 (refer to FIGS. 2 and 3).

Figure 6:
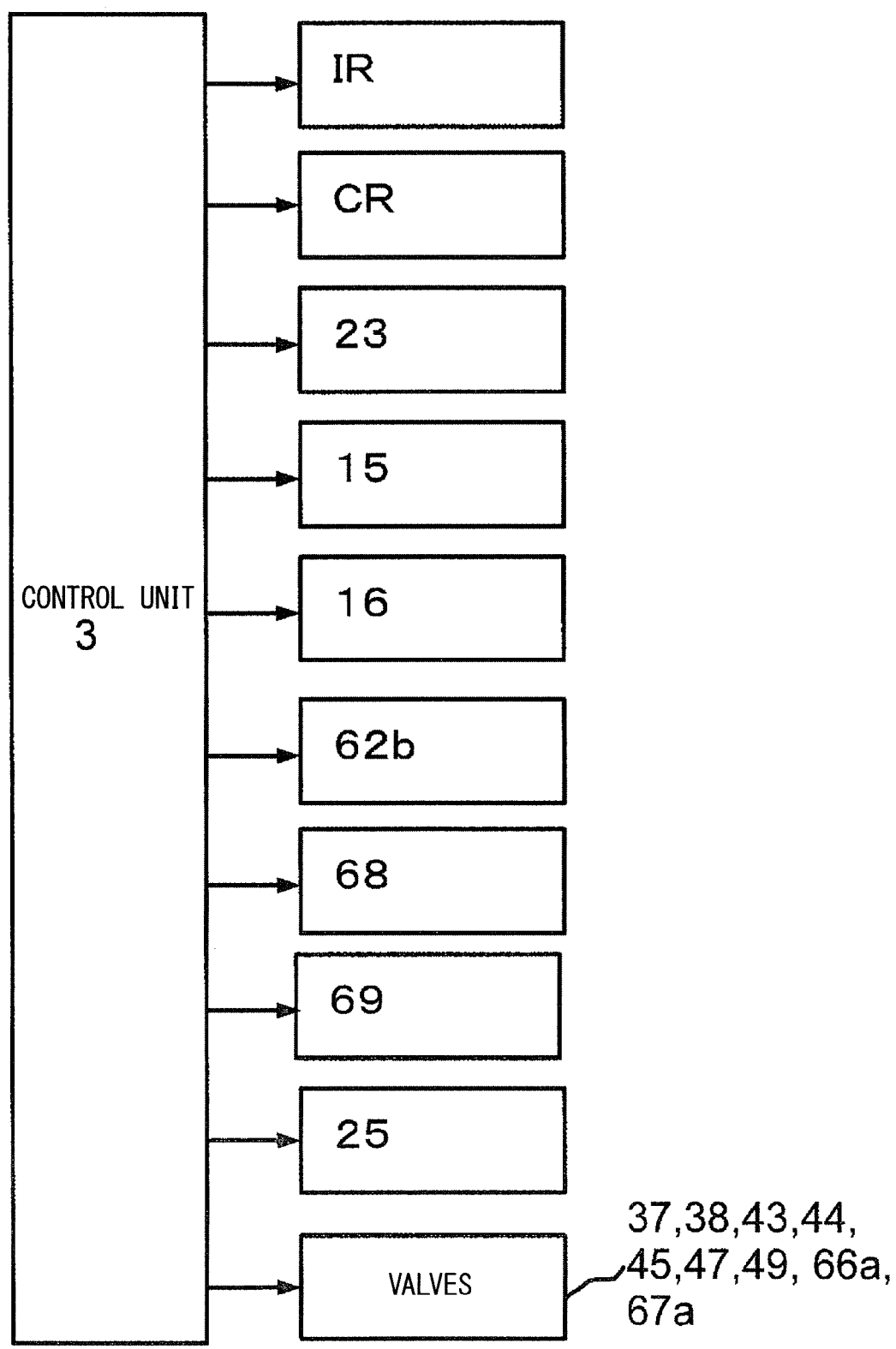
FIG. 6 is a block diagram for illustrating an electrical configuration of a main portion of a substrate treatment apparatus.

FIG. 6 is a block diagram for illustrating an electrical configuration of a main portion of the substrate treatment apparatus 1. A control unit 3 includes a microcomputer to control a control target provided in the substrate treatment apparatus 1 according to a predetermined control program. In particular, the control unit 3 controls operation of transfer robots IR and CR, an electric motor 23 for rotationally driving the spin chuck 5, a first nozzle moving unit 15, a second nozzle moving unit 16, a chuck-pin driving unit 25, valves 37, 38, 43, 44, 45, 47, 49, 66a, and 67a, the cylinder 62b of the push-up pin unit 62, the inert gas supply means 68, the suction means 69, the heating element inside the heater body 60, and the like.

Figure 7:
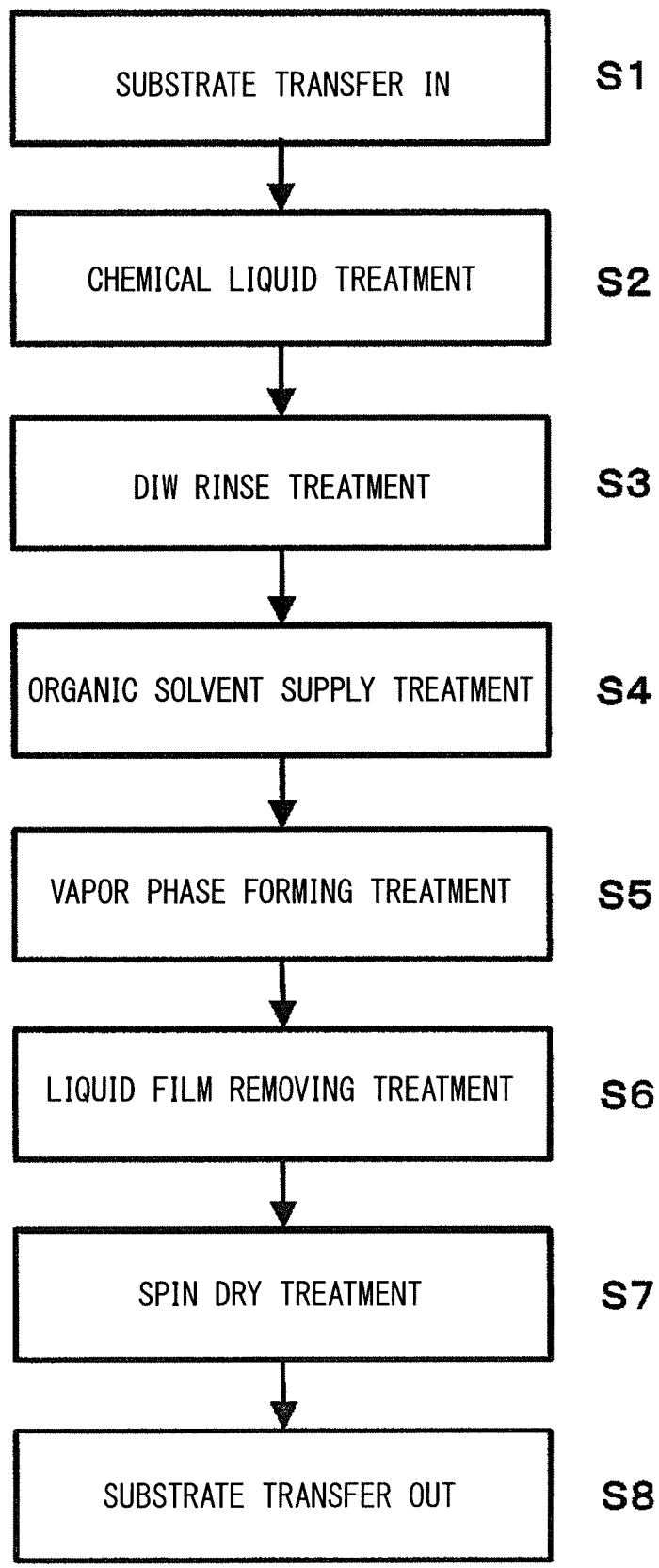
FIG. 7 is a flowchart for illustrating an example of substrate treatment by a substrate treatment apparatus.

FIG. 7 is a flowchart for illustrating an example of substrate treatment by the substrate treatment apparatus 1. An untreated substrate W is transferred from the carrier C to the treatment unit 2 by the transfer robots IR and CR, and is delivered to the spin chuck 5 (S1). The control unit 3 controls the chuck-pin driving unit 25 so as to cause the chuck pin 20 to be in the open state. In this state, the transfer robot CR delivers the substrate W to the spin chuck 5. The substrate W is placed on the support portion 52 (support surface 52a) of the chuck pin 20 in the open state. After that, the control unit 3 controls the chuck pin drive unit 25 so as to cause the chuck pin 20 to be in the closed state. This causes the substrate W to be held by the holding portion 51 of each of the plurality of chuck pins 20.

After the transfer robot CR retracts to the outside of the treatment unit 2, chemical liquid treatment (S2) is started. At this time, the heater body 60 is to be positioned at the lower position away from below the substrate W. Then, the pin 62a is to be positioned at a retracted position.

First, the control unit 3 causes a heating element (not illustrated) inside the heater body 60 to heat. Next, the control unit 3 causes the electric motor 23 to be driven to rotate the spin base 21 at a predetermined rotational speed. The control unit 3 causes the inert gas supply means 68 to supply an inert gas to the charging branch pipe 66, and causes the charging valve 66a to open. This causes the inert gas supplied from the inert gas supply means 68 to be discharged toward a lower surface of a substrate W from the plurality of gas nozzles 61 through the charging branch pipe 66 and the pipe 65. The discharged inert gas fills a space between the substrate W and the heater body 60, and forms a gas flow of the inert gas flowing to the periphery through a clearance between the substrate W and the spin base 21.

Meanwhile, the control unit 3 causes the second nozzle moving unit 16 to dispose the second moving nozzle 12 at a chemical liquid treatment position above the substrate W. The chemical liquid treatment position may be a position at which a chemical liquid discharged from the second moving nozzle 12 is deposited on the rotation center of the upper surface of the substrate W. Then, the control unit 3 causes the chemical liquid valve 43 to open. This causes the second moving nozzle 12 to supply the chemical liquid toward the upper surface of the substrate W in a rotating state. The supplied chemical liquid is spread over the entire surface of the substrate W by centrifugal force. Some of the chemical liquid supplied to the substrate W falls downward from a peripheral edge of the substrate W. Some of the fallen chemical liquid is formed into a mist. At this time, the heater upper surface 60a is in a heating state, so that the chemical liquid adhering to the heater upper surface 60a is evaporated. As a result, the inside of the chamber 13 may be contaminated. Meanwhile, an air flow of an inert gas flowing from the clearance between the substrate W and the spin base 21 to the periphery is formed by the gas nozzle 61, as described above. Accordingly, the air flow of an inert gas prevents a chemical liquid or the like falling from the peripheral edge of the substrate W from entering the clearance. This enables the chemical liquid or the like to be effectively prevented from adhering to the heater upper surface 60a. It is also possible to prevent the chemical liquid or the like from entering the gas nozzle 61.

After the chemical liquid treatment for a predetermined time, DIW rinse treatment (S3) for removing a chemical liquid from a substrate W is performed by replacing the chemical liquid on the substrate W with DIW. Specifically, the control unit 3 causes the chemical liquid valve 43 to close, and instead causes the DIW valve 47 to open. This causes the DIW nozzle 10 to supply the DIW toward the upper surface of the substrate W in a rotating state. The supplied DIW is spread over the entire surface of the substrate W by centrifugal force. This DIW washes out the chemical liquid on the substrate W. Meanwhile, the control unit 3 causes the second nozzle moving unit 16 to retract the second moving nozzle 12 from above the substrate W to the side of the cup 8. The discharge of an inert gas from the gas nozzle 61 is performed in parallel with the DIW rinse treatment (S3).

After the DIW rinsing treatment for a predetermined time, organic solvent supply treatment (S4) is started to supply an organic solvent being a treatment liquid ("low surface tension liquid") having a surface tension lower than that of DIW to the substrate W to replace the DIW on the upper surface of the substrate W with the organic solvent. The control unit 3 causes the first nozzle moving unit 15 to move the first moving nozzle 11 to an organic solvent rinsing position above the substrate W. The organic solvent rinse position may be a position at which the organic solvent (e.g., IPA) discharged from the first moving nozzle 11 is deposited on the rotation center of the upper surface of the substrate W. Then, the control unit 3 causes the DIW valve 47 to close, and causes the organic solvent valve 37 to open. This causes the first moving nozzle 11 to supply the organic solvent (liquid) toward the upper surface of the substrate W in a rotating state. The supplied organic solvent is spread over the entire surface of the substrate W by centrifugal force to replace the DIW on the substrate W. The discharge of an inert gas from the gas nozzle 61 described above is performed in parallel with the organic solvent supply treatment (S4). In a final stage of the organic solvent supply treatment (S4), the control unit 3 causes the lifting mechanism 64 to raise the heater body 60 from the lower position to the proximity position. This causes the heater upper surface 60a to approach the lower surface of the substrate W to heat the substrate W from below. The discharge of an inert gas from the gas nozzle 61 described above is performed in parallel with the organic solvent supply treatment (S4).

When the replacement of the DIW by the organic solvent is completed, the control unit 3 causes the rotation of the spin chuck 5 to decelerate to stop the rotation of the substrate W, and causes the organic solvent valve 37 to close to stop supplying the organic solvent. This causes a paddle state where an organic solvent liquid film is supported on the substrate W in a stationary state by surface tension. In addition, heating of the substrate W evaporates some of the organic solvent in contact with the upper surface of the substrate W, so that a vapor phase layer is formed between the organic solvent liquid film and the upper surface of the substrate W. This causes the organic solvent liquid film to float above the substrate W in a liquid mass state (vapor phase forming treatment (S5)). The discharge of an inert gas from the gas nozzle 61 is performed in parallel with the vapor phase forming treatment (S5).

Next, removal of the organic solvent liquid film is performed. First, the control unit 3 causes the chuck-pin drive unit 25 to open the chuck pins 20. This releases holding of the substrate W by the holding portion 51 of each of the plurality of chuck pins 20. Subsequently, the control unit 3 causes the charging valve 66a to close, and stops the inert gas supply means 68. This stops the discharge of an inert gas from the gas nozzle 61. The control unit 3 causes the suction means 69 to operate, and at the same time causes the suction valve 67a to open.

In this state, the control unit 3 causes the lifting mechanism 64 to raise the heater body 60 to the upper position to bring the heater upper surface 60a into contact with the lower surface of the substrate W. This generates a suction force in the gas nozzle 61 to bring the lower surface of the substrate W into close contact with the heater upper surface 60a.

In parallel with the close contact of the substrate W by the gas nozzle 61 as described above, the control unit 3 causes the first nozzle moving unit 15 to retract the first moving nozzle 11 from above the substrate W to the side of the cup 8. The control unit 3 also causes the second nozzle moving unit 16 to dispose the second moving nozzle 12 at a gas discharge position above the substrate W. The gas discharge position may be a position at which a flow of an inert gas discharged from the second moving nozzle 12 is directed to the rotation center of the upper surface of the substrate W. Then, the control unit 3 causes the inert gas valve 44 to open to discharge an inert gas to an organic solvent liquid film on the substrate W. As a result, the organic solvent liquid film is removed by the inert gas at the position at which the inert gas is discharged, or at the center of the substrate W, and a hole exposing the upper surface of the substrate W is formed at the center of the organic solvent liquid film. Expanding this hole discharges the organic solvent on the substrate W to the outside of the substrate W (liquid film removing treatment (S6)).

If a substrate W is merely brought into contact with the heater upper surface 60a, it is conceivable that the substrate W is thermally deformed to cause the peripheral portion thereof to be convex (i.e., curved in a concave shape in the substrate diameter direction). In this case, the peripheral portion of the substrate W is not brought into contact with the heater upper surface 60a to cause heating by the heater body 60 to be insufficient. This may cause the organic solvent liquid film not to float at the peripheral portion of the substrate. The organic solvent liquid film also may not smoothly move from the center of the substrate W to the periphery thereof in the liquid film removing treatment (S6).

Thus, in the present preferred embodiment, a substrate W is brought into close contact with the heater upper surface 60a by using a suction force from the gas nozzle 61 in the liquid film removing treatment (S6). This causes the substrate W to maintain its flatness by following the heater upper surface 60a. Thus, the peripheral portion of the substrate W can be sufficiently heated through the liquid film removing treatment (S6). In addition, the organic solvent liquid film can be smoothly moved from the center of the substrate W to the periphery thereof. Further, in the present preferred embodiment, the gas nozzle 61 generates a suction force for sucking (adsorbing) the substrate W onto the heater upper surface 60a in the liquid film removing treatment (S6), and the gas nozzle 61 ejects an inert gas toward the lower surface of the substrate W in the chemical liquid treatment (S2), the DIW rinse treatment (S3), and the organic solvent supply treatment (S4). As described above, the gas nozzles 61 constituting a part of the suction force generation mechanism and the inert gas discharge mechanism can be used in common, so that the present invention can be achieved at a relatively low cost.

After the organic solvent treatment is finished as described above, the control unit 3 causes the inert gas valve 44 to close to retract the second moving nozzle 12. After that, the suction means 69 is stopped and the suction valve 67a is closed to stop a suction force of the gas nozzle 61. Subsequently, the control unit 3 causes the cylinder 62b of the push-up pin unit 62 to shift the pin 62a to a projecting state. As a result, the substrate W is lifted from the lower surface to be away from the heater upper surface 60a.

Then, the control unit 3 causes the lifting mechanism 64 to lower the heater body 60 toward the lower position. During a process of lowering the heater body 60, a peripheral edge of the substrate W is placed on the support portion 52 of the chuck pin 20. When the peripheral edge of the substrate W is placed on each of the chuck pins 20, the control unit 3 causes the chuck-pin driving unit 25 to cause each of the chuck pins 20 to be the closed state. As a result, the substrate W is held by the holding portion 51 of each of the chuck pins 20. Then, the liquid film removing treatment (S6) is completed.

Next, the control unit 3 causes the electric motor 23 to rapidly rotate the substrate W at a drying rotational speed. This performs a dry treatment (S7: spin dry) for spinning off the liquid component on the substrate W by using a centrifugal force.

After that, the control unit 3 causes the electric motor 23 to stop the rotation of the spin chuck 5. The control unit 3 also causes the chuck pin drive unit 25 to cause the chuck pins 20 to be the open state. This shifts the substrate W from a state of being held by the holding portion 51 of each of the chuck pins 20 to a state of being placed on each of the support portions 52. After that, the transfer robot CR enters the treatment unit 2, and scoops up the treated substrate W from the spin chuck 5 to transfer it to the outside of the treatment unit 2 (S8). The substrate W is delivered to the transfer robot IR from the transfer robot CR, and is stored in the carrier C by the transfer robot IR.

Figure 8A:
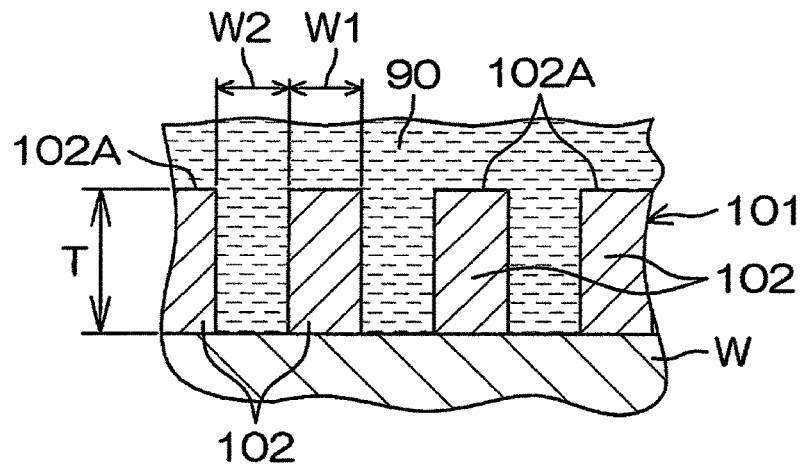
FIG. 8A is a schematic sectional view for illustrating formation of a vapor phase layer on an upper surface of a substrate.
Figure 8B:
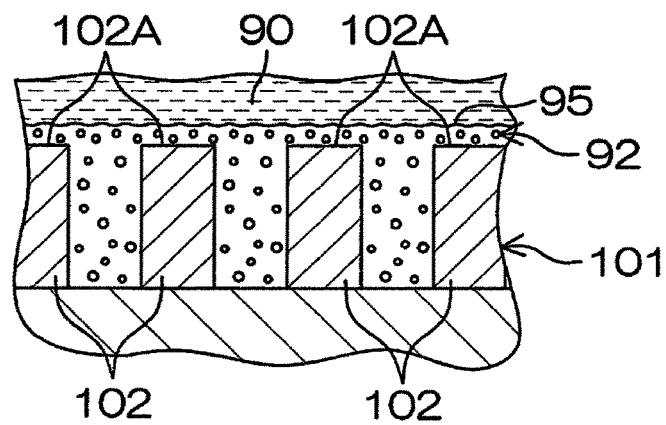
FIG. 8B is a schematic sectional view for illustrating formation of a vapor phase layer on an upper surface of a substrate.

FIG. 8A and FIG. 8B each are a schematic sectional view for illustrating formation of a vapor phase layer on an upper surface of a substrate W. The substrate W is provided in this surface with a fine pattern 101. The pattern 101 includes fine projecting structures 102 formed on the surface of the substrate W. The structures 102 each may include an insulator film or a conductor film. In addition, the structures 102 each may be a laminated film in which a plurality of films is laminated. When the linear structures 102 are adjacent to each other, a groove (groove) is formed therebetween. In this case, the structures 102 each may have a width W1 of about 10 nm to 45 nm, and an interval W2 between the structures 102 may be about 10 nm to several μm. The structures 102 each may have a height T of about 50 nm to 5 μm, for example. When the structures 102 each have a cylindrical shape, a hole is to be formed inside each of the structures 102.

In an initial stage of the organic solvent supply treatment (S4), an organic solvent liquid film 90 formed on the surface of the substrate W fills the inside of the pattern 101 (a space between the adjacent structures 102, or an internal space of the cylindrical structure 102) as illustrated in FIG. 8A.

During a process in which an organic solvent liquid film floats, the substrate W is heated to a temperature higher than the boiling point of the organic solvent (82.4° C. in the case of IPA) by a predetermined temperature (e.g., 10° C. to 50° C.). This causes the organic solvent in contact with the surface of the substrate W to be evaporated, so that a gas of the organic solvent is generated to form a vapor phase layer 92 as illustrated in FIG. 8B. The vapor phase layer 92 fills the inside of the pattern 101 and reaches the outside of the pattern 101 to form an interface 95 with the organic solvent liquid film 90 above a top surface 102A of each of the structures 102. The organic solvent liquid film 90 is supported on the interface 95. In this state, the organic solvent liquid surface is not in contact with the pattern 101, so that pattern collapse due to surface tension of the organic solvent liquid film 90 does not occur.

When a substrate W is heated by the heater body 60 during a process of the vapor phase forming treatment (S5), the organic solvent is evaporated by a temperature rise on the upper surface of the substrate W. As a result, the liquid organic solvent is instantly discharged from the pattern 101. Then, an organic solvent in a liquid phase is supported on the vapor phase layer 92 formed, and is separated from the pattern 101. As described above, the vapor phase layer 92 of the organic solvent is interposed between the top surface of the pattern 101 (the top surface 102A of the structure 102) and the organic solvent liquid film 90 to support the organic solvent liquid film 90.

Figure 8C:
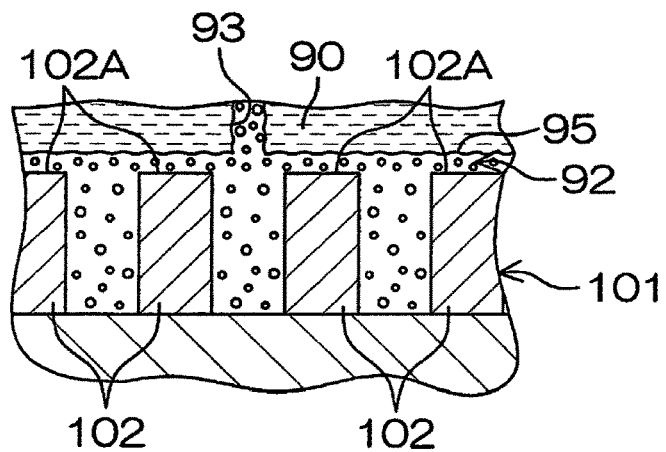
FIG. 8C is a sectional view for illustrating a split of a liquid film.

As illustrated in FIG. 8C, when a crack 93 is generated in the organic solvent liquid film 90 floating from the upper surface of the substrate W, the crack 93 causes a defect such as a watermark after drying. Thus, in the present preferred embodiment, after rotation of the substrate W is stopped in the vapor phase forming treatment (S5), supply of the organic solvent is stopped to form the thick organic solvent liquid film 90 on the substrate W to avoid occurrence of a crack. In organic solvent treatment step (S4), the substrate W does not rotate at a high speed (e.g., 100 rpm) and rotation of the substrate W is stopped or the substrate W rotates at a low speed (e.g., less than 100 rpm), so that the liquid film 90 is not split due to a centrifugal force. Thus, it is possible to avoid occurrence of a crack in the liquid film 90. In addition, power output of the heating element in the heater unit 6 and heating time of a substrate are appropriately adjusted to prevent vapor of the organic solvent from breaking through the liquid film 90 to blow out, thereby avoiding occurrence of a crack.

In a state where the organic solvent liquid film 90 is supported on the vapor phase layer 92, frictional resistance acting on the organic solvent liquid film 90 is small enough to be regarded as zero. Thus, when a force in a direction parallel to the upper surface of the substrate W is applied to the organic solvent liquid film 90, the organic solvent liquid film 90 easily moves. In the present preferred embodiment, an opening is formed at the center of the organic solvent liquid film 90, and thus a flow of the organic solvent is generated by a temperature difference at the edge of the opening to move and remove the organic solvent liquid film 90 supported on the vapor phase layer 92.

In the present preferred embodiment, the substrate W is heated while the substrate W is in close contact with the heater upper surface 60a in the liquid film removing treatment (S6). Thus, the substrate W can be heated while its flatness is maintained by following the heater upper surface 60a.

While the preferred embodiment of the present invention has been described above, the present invention can be practiced in still another preferred embodiment. Several forms falling within the scope of the present invention are exemplified below.

1. Besides IPA, methanol, ethanol, acetone, and hydro fluoroether (HEF) can be exemplified as an available organic solvent. Any one of them is an organic solvent having a smaller surface tension than water (DIW). The present invention can also be applied to treatment liquids other than an organic solvent. For example, the present invention may be applied to remove a rinsing liquid such as water to the outside of a substrate. As the rinsing liquid, besides water, carbonated water, electric field ion water, ozone water, hydrochloric acid water at a diluted concentration (for example, about 10 to 100 ppm), reduced water (hydrogen water), and the like can be exemplified.

2. As a gas discharged from the first moving nozzle 11 in the liquid film removing treatment, besides a nitrogen gas, clean air and another inert gas can be used. Likewise, an inert gas other than a nitrogen gas can be used from the gas nozzle 61.

3. While the spin dry treatment (S7) is performed after completion of the liquid film removing treatment (S6) in the present preferred embodiment, it is not absolutely necessary to perform the spin dry treatment (S7) if the liquid phase can be completely removed from the upper surface of the substrate W by the liquid film removing treatment (S6).

While the invention has been shown and described in detail, the foregoing description is in all aspects illustrative and not restrictive. It is therefore understood that numerous modifications and variations can be devised without departing from the scope of the invention.

What is claimed is:

1. A substrate treatment method comprising the steps of:
   holding a circumference of a substrate with a chuck member;
   rotating the substrate around a rotating axis;
   supplying a rinsing liquid to an upper surface of the substrate held by said chuck member;
   supplying a low surface tension liquid to replace said rinsing liquid to the upper surface of said substrate;
   discharging an inert gas toward a liquid film of the low surface tension liquid discharged to the upper surface of said substrate;

disposing a heater at a separation position separate downward from a lower surface of said substrate, and supplying other inert gas above said heater through a gas nozzle provided in an upper surface of said heater while said heater heats the lower surface of said substrate in said supplying of said rinsing liquid or in said supplying of the low surface tension liquid; and relatively moving up said heater with respect to said substrate to dispose said heater at a contact position allowing said heater to be brought into contact with the lower surface of said substrate, and sucking an atmosphere above said heater through the gas nozzle while said heater heats the lower surface of said substrate in said discharging.

2. A substrate treatment method comprising the steps of:

holding a circumference of a substrate with a chuck member;

rotating the substrate around a rotating axis;

supplying a rinsing liquid to an upper surface of the substrate held by said chuck member;

supplying a low surface tension liquid to replace said rinsing liquid to the upper surface of said substrate; and discharging an inert gas toward a liquid film of the low surface tension liquid discharged to the upper surface of said substrate, wherein said supplying of the low surface tension liquid includes a first substrate-heating step of disposing a heater having an upper surface that is a plane, at a proximity position close to a lower surface of said substrate, and heating the lower surface of said substrate with said heater, and said discharging includes a second substrate-heating step of disposing said heater at a contact position allowing the upper surface of said heater to be brought into contact with the lower surface of said substrate, heating the lower surface of said substrate with said heater, and bringing the lower surface of said substrate into close contact with the upper surface of said heater through sucking an atmosphere using a gas nozzle provided in the upper surface of said heater.

3. The substrate treatment method according to claim 2, wherein in said second substrate-heating step, rotation of the substrate is stopped.

4. The substrate treatment method according to claim 2, further comprising:

supplying a chemical liquid to the upper surface of said substrate held by said chuck member, before said supplying of said rinsing liquid; and disposing said heater at a separation position separate downward from the lower surface of said substrate, and discharging other inert gas above said heater through the gas nozzle in said supplying of the chemical liquid.

5. The substrate treatment method according to claim 4, wherein said supplying of said rinsing liquid includes disposing said heater at the separation position, and discharging an inert gas above said heater through the gas nozzle.

6. The substrate treatment method according to claim 5, wherein said supplying of the low surface tension liquid includes discharging an inert gas above said heater through the gas nozzle.

* * * * *